United States Patent
Tucholski (10) Patent No.: US 6,184,794 B1
(45) Date of Patent: Feb. 6, 2001

(54) PORTABLE LIGHTING DEVICE HAVING EXTERNALLY ATTACHED VOLTAGE TESTER

(75) Inventor: Gary R. Tucholski, Parma Heights, OH (US)

(73) Assignee: Eveready Battery Company, Inc., St. Louis, MO (US)

(*) Notice: Under 35 U.S.C. 154(b), the term of this patent shall be extended for 0 days.

(21) Appl. No.: 08/655,557

(22) Filed: May 30, 1996

Related U.S. Application Data

(63) Continuation of application No. 08/148,074, filed on Nov. 1, 1993, now abandoned.

(51) Int. Cl.[7] .................................................. G08B 21/00
(52) U.S. Cl. ............................ 340/636; 324/426; 324/435; 320/48; 429/93
(58) Field of Search .......................... 340/636; 324/425, 324/426, 427, 435; 320/2, 48, 30; 29/623.4; 429/93, 90

(56) References Cited

U.S. PATENT DOCUMENTS

| | | |
|---|---|---|
| 945,564 | 1/1910 | Marko . |
| 1,497,388 | 1/1924 | Sterling . |
| 2,980,754 | 4/1961 | Reilly et al. ................... 136/182 |
| 3,500,372 | 3/1970 | Thiele ............................ 340/249 |
| 3,514,338 | 5/1970 | Shakour ......................... 136/192 |
| 3,563,806 | 2/1971 | Hruden .......................... 136/112 |
| 3,667,039 | 5/1972 | Garfein et al. ................... 324/92 |
| 3,764,893 | 10/1973 | Weigand ......................... 324/432 |
| 3,773,563 | 11/1973 | Eaton, Jr. et al. ................ 429/91 |
| 3,823,367 | 7/1974 | Kaye et al. ...................... 324/426 |
| 4,006,414 | 2/1977 | Parker ............................ 324/106 |
| 4,027,231 | 5/1977 | Lohrmann ........................ 324/433 |
| 4,060,666 | 11/1977 | Anes .............................. 429/91 |
| 4,118,112 | 10/1978 | Thornburg ........................ 359/44 |
| 4,173,733 | 11/1979 | Sugalski et al. .................. 320/48 |

(List continued on next page.)

FOREIGN PATENT DOCUMENTS

| | | |
|---|---|---|
| A10501609 | 2/1992 | (EP) . |
| A20497616 | 5/1992 | (EP) . |
| A20497617 | 5/1992 | (EP) . |
| A10523901 | 1/1993 | (EP) . |
| 1153226 | 5/1969 | (GB) . |
| 57-153275 | 9/1982 | (JP) . |
| 60-52189 | 11/1985 | (JP) . |
| 63-213256 | 9/1988 | (JP) . |
| 313379 | 6/1989 | (JP) . |
| 4329385 | 4/1991 | (JP) . |
| 4329384 | 11/1992 | (JP) . |
| 8600282A | 2/1956 | (NL) . |
| WO9203852 | 3/1992 | (WO) . |
| WO9213368 | 8/1992 | (WO) . |

* cited by examiner

Primary Examiner—Jeffery Hofsass
Assistant Examiner—Julie B. Lieu
(74) Attorney, Agent, or Firm—Robert W. Welsh; S. Allan Fraser (57) ABSTRACT

A battery tester for use in combination with a portable lighting device such as a flashlight or lantern having a housing for retaining at least one battery including first and second terminals, each in electrical contact with an opposite pole of the battery, a conductor located on the exterior of the housing and having one end in electrical contact with the first terminal and an opposite end operably connectable to the second terminal. An indicator material overlies and is in responsive contact with the conductor to respond to and indicate a state that is present in the conductor. The indicator material is preferably a thermochromic ink responsive to heat changes in the conductor caused by a current flowing therethrough. The conductor and indicator material are preferably mounted on a flexible substrate imprinted with decorative ink and indicia and protected by a transparent protective layer.

8 Claims, 4 Drawing Sheets

U.S. PATENT DOCUMENTS

| | | | |
|---|---|---|---|
| 4,198,597 | 4/1980 | Sawyer | 324/434 |
| 4,316,185 | 2/1982 | Watrous et al. | 340/636 |
| 4,360,780 | 11/1982 | Skutch, Jr. | 324/437 |
| 4,365,241 | 12/1982 | Morishita | 340/636 |
| 4,371,827 | 2/1983 | Mullersman et al. | 320/48 |
| 4,379,816 | 4/1983 | Mullersman et al. | 429/91 |
| 4,392,102 | 7/1983 | Sugalski et al. | 320/48 |
| 4,421,560 | 12/1983 | Kito et al. | 427/150 |
| 4,432,041 | 2/1984 | Pfisterer et al. | 362/86 |
| 4,497,881 | 2/1985 | Bertolino | 429/91 |
| 4,520,353 | 5/1985 | McAuliffe | 340/636 |
| 4,536,757 | 8/1985 | Ijntema | 340/636 |
| 4,560,937 | 12/1985 | Finger | 324/433 |
| 4,626,765 | 12/1986 | Tanaka | 320/48 |
| 4,702,563 | 10/1987 | Parker | 359/44 |
| 4,702,564 | 10/1987 | Parker | 359/44 |
| 4,723,656 | 2/1988 | Kiernan et al. | 206/333 |
| 4,726,661 | 2/1988 | Parker | 359/44 |
| 4,727,006 | 2/1988 | Malinowski et al. | 429/50 |
| 4,737,020 | 4/1988 | Parker | 359/87 |
| 4,801,514 | 1/1989 | Will et al. | 429/167 |
| 4,835,475 | 5/1989 | Hanakura et al. | 324/435 |
| 4,835,476 | 5/1989 | Kurosawa | 324/435 |
| 4,876,632 | 10/1989 | Osterhout et al. | 362/183 |
| 4,911,994 | 3/1990 | Will et al. | 429/167 |
| 4,917,973 | 4/1990 | Yoshimoto et al. | 429/91 |
| 4,962,347 | 10/1990 | Burroughs et al. | 320/40 |
| 5,015,544 | 5/1991 | Burroughs et al. | 429/93 |
| 5,059,895 | 10/1991 | Cataldi et al. | 324/104 |
| 5,105,156 | 4/1992 | Bohmer | 324/435 |
| 5,128,616 | 7/1992 | Palmer | 324/435 |
| 5,130,658 | 7/1992 | Bohmer | 324/435 |
| 5,132,176 | 7/1992 | Valentine | 429/91 |
| 5,156,931 | 10/1992 | Burroughs et al. | 429/93 |
| 5,188,231 | 2/1993 | Kivell et al. | 206/333 |
| 5,223,003 | 6/1993 | Tucholski et al. | 29/623.4 |
| 5,231,356 | 7/1993 | Parker | 324/435 |
| 5,250,905 | 10/1993 | Kuo et al. | 324/435 |
| 5,262,728 * | 11/1993 | Shershen | 324/506 |
| 5,389,458 * | 2/1995 | Weiss et al. | 429/90 |

PORTABLE LIGHTING DEVICE HAVING EXTERNALLY ATTACHED VOLTAGE TESTER

CROSS-REFERENCE TO RELATED CASE

This is a file wrapper continuation of application Ser. No. 08/148,074 filed Nov. 1, 1993, now abandoned for Portable Lighting Device Having Externally Attached Voltage Tester.

BACKGROUND OF THE INVENTION

1. Field of the Invention

The instant invention relates generally to portable lighting devices such as battery-powered flashlights and lanterns, and particularly to a built-in device for indicating the level of charge or capacity of the batteries contained therein.

2. Discussion of the Related Art

Flashlights and a majority of portable lanterns are battery-operated using either non-rechargeable or rechargeable batteries. One problem commonly associated with these batteries is determining the useful or remaining life of the battery. If the batteries are already in a flashlight or portable lantern, the quickest way to determine the strength of the battery is by turning the flashlight or lantern on. If the incandescent or fluorescent lamp illuminates, most individuals are satisfied that the batteries are good. However, if the flashlight or portable lantern does not illuminate, then the question is whether the problem lies in the batteries or the lamp. The user must then either replace the batteries in the flashlight with new batteries and/or the lamp, or remove the existing batteries and/or the lamp and test them.

Several devices have been developed for testing batteries to determine the freshness or state-of-charge of the cell. For example, U.S. Pat. Nos. 4,723,656 and 5,128,616 disclose a blister-type package for new batteries with a battery condition indicator built into the blister portion of the package. The blister can be deformed to place the tester across the terminals of the battery to be tested. The tester employs a thermochromic material in combination with a resistive element. The flow of current produces a temperature gradient across the resistive element which, in turn, causes a color change in the thermochromic material to indicate the state-of-charge of the battery. As mentioned, the testers are associated with the package in which the batteries are purchased. Once the batteries are removed from the package, the package is usually discarded and from then on the state-of-charge of the battery is indeterminate.

U.S. Pat. Nos. 4,702,563, 4,702,564, 4,726,661, and 4,737,020, disclose a flexible battery tester which has a conductive circuit pattern associated with a layer of thermochromic material. The flexible member is bent so that the circuit pattern can contact the positive and negative terminals of the battery to be tested and, again, the temperature gradient is observed in the thermochromic material and correlated with the state-of-charge of the battery. All of these testers suffer from the same deficiency in that the tester is a separate element, which in the case of the package, is usually thrown away, and in the case of the above patents, can be lost or misplaced. In either event, the state-of-charge of the battery is indeterminate once the testing device is no longer available.

U.S. Pat. No. 4,876,632 discloses a flashlight containing a device for indicating the level of charge on a battery. The battery life indicator is a module that is mounted between the flashlight head or lamp assembly containing the light reflector and a battery housing assembly for holding the batteries. The battery life indicator module contains an indicator, such as a light-emitting diode (LED). Internal to the battery life indicator module is a circuit which measures the battery level and activates the indicator to display the battery level. The module also provides the necessary electrical connection between the batteries and the light lamp of the flashlight. The battery life indicator is activated by the On/Off switch of the flashlight so that the power is not drained when the flashlight is not in use. However, when the flashlight is turned on, the battery-life indicator module and its associated circuit are also powered and remain on while the flashlight is on. In the event the flashlight lamp burns out, and the operator fails to notice that the battery-life indicator is activated, the tester will result in a discharge of the batteries.

U.S. Pat. No. 4,962,347 discloses a battery-powered flashlight or portable lantern having a built-in device for determining the strength, voltage or capacity of the batteries. The flashlight or lantern includes a housing which holds the batteries and which receives an electrically powered light source mounted thereon which is energized by the batteries. A battery-testing circuit is mounted in the housing having a display which is detectable from the outside of the housing. A three-way switch mounted in the housing is placed in a first position to connect the light source with the batteries, and in a second position to connect the battery-testing circuit with the batteries, and a third position to disconnect the batteries from both of the light and the battery-testing circuit.

U.S. Pat. No. 4,432,041 discloses a portable lighting device which includes circuitry for detecting a low voltage condition of the batteries. Upon the detection of a low voltage condition, the circuitry provides an intermittent sound that is indicative of the low voltage condition. A disadvantage associated with this circuitry is that the tester is constantly "ON" in order to monitor the voltage level. Furthermore, the tester circuitry only provides an indication when the voltage level of the batteries are below a certain level. There is no indication as to the remaining life of the battery and the state-of-charge of the battery is indeterminate.

In view of these disadvantages, a battery tester forming an integral part of the flashlight housing which is not in series with a circuit operating the flashlight is desired.

SUMMARY OF THE INVENTION

According to one aspect of the invention, a flashlight or lantern includes a housing for retaining at least one battery and a light source attached to the housing and operable by the battery, and a laminated battery tester fixed to the exterior surface of the housing and having one end operably connected to one pole of the battery and an opposite end operably connectable to an opposite pole of the battery wherein the laminated battery tester provides an indication of the strength of the battery. The battery tester includes a flexible substrate having an indicator material located on one side of the substrate and a conductor located on a side opposite thereto. The conductor has one end operably connected to the one pole of the battery and an opposite end is operably connectable to the opposite pole of the battery.

In another aspect of the invention, a flashlight or lantern housing has first and second terminals, each in electrical continuity with one pole of at least one battery contained within the housing. A display circuit mounted on the exterior of the housing has a first end in electrical contact with the first terminal and a second end engageable with the second terminal whereby depression of the second end results in a current to flow through the display circuit and providing an indication of the strength of the battery.

According to yet another aspect of the invention, a battery tester is provided for use on the exterior of a flashlight or lantern having a housing for retaining one or more batteries and a light source operably connected through a switch to the battery. In this environment, the battery tester includes in combination a conductor fixed to the exterior of the housing and having a first end operably coupled by a terminal to one pole of the battery and a second end in switching relationship to a second terminal operably coupled to an opposite pole of the battery. The conductor includes a region between the two ends having a controlled resistance to an electrical current. A responsive display overlying the conductor displays the remaining capacity in the battery when electrical current flows through the conductor upon the closing of the switch between the conductor second end and the second terminal. In the case where the flashlight or lantern housing is metallic, the housing serves as one terminal for the conductor. The opposite terminal of the flashlight or lantern is insulated from housing and operably connectable with the conductor.

In one form of the invention, a Belleville switch mechanism is used to make the electrical connection between the conductor and the one terminal of the flashlight or lantern. The switching mechanism includes a conductive plunger having one end overlain by the end of the conductor. The plunger is held away from the flashlight or lantern terminal by a Belleville spring disposed between the plunger and the housing. To activate or close the switch, the operator depresses the plunger which contacts the terminal allowing current to flow through the conductor and activate the display. Release of the switch results in the Belleville spring urging the plunger away from the terminal and opening the circuit.

The battery tester of this invention will function to indicate the battery state-of-charge even if the flashlight or lantern lamp is not functioning, unlike some prior testers where the lamp remains in series with the tester and the batteries. Another advantage of this invention is the low profile, easy construction and low cost to manufacture.

BRIEF DESCRIPTION OF THE DRAWING FIGURES

The above advantages, purposes and other features of the invention will become apparent from a study of the following detailed description taken in conjunction with the appended drawing figures, wherein:

FIGS. 7 and 7b are fragmentary sectional views of an alternate embodiment of a switch for use in the battery tester shown in FIGS. 2–6.

DETAILED DESCRIPTION OF PREFERRED EMBODIMENTS

Figure 1:
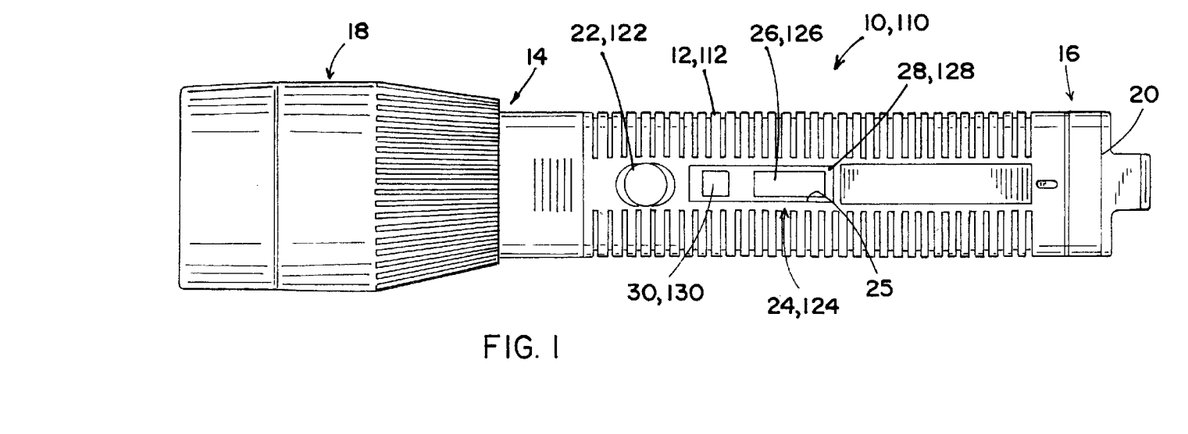
FIG. 1 is a side elevational view of a flashlight.
Figure 2:
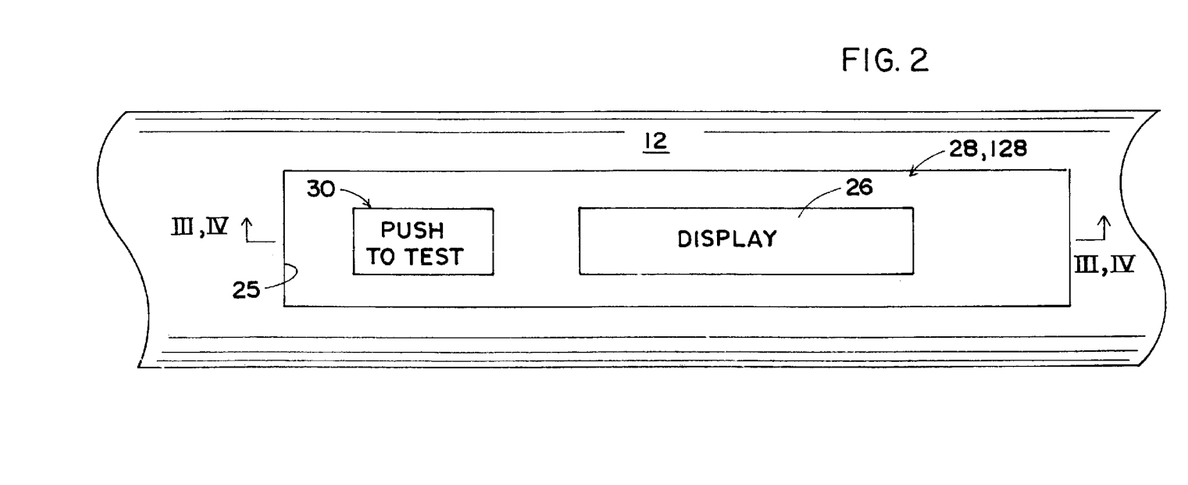
FIG. 2 is an enlarged fragmentary plan view of a battery tester on the flashlight shown in FIG. 1.

Referring to FIGS. 1 and 2, a flashlight or portable lantern 10 generally includes an elongate tubular body or housing 12 having a first end 14 and a second end 16. Tubular body 12 contains a longitudinal battery retention chamber which is dimensioned to accommodate one or more dry-cell batteries used to operate a lamp assembly 18 (not shown in detail) mounted to the first end 14 of tubular body 12. The second end 16 of tubular body 12 may be sealed or receive an end cap 20 which may be removed to insert and remove the batteries received within the battery retention chamber of tubular body 12. Lamp assembly 18 may be operably coupled to the batteries by a switch 22 such as a push button, slide or rotary type.

In a preferred embodiment, flashlight or lantern 10 also includes a battery tester 24 which is fixed to the exterior of tubular body 12. As shown generally in FIGS. 2–3, battery tester 24 is preferably a low profile circuit made from a multi-laminate film adhered to the exterior of tubular body 12. If desired, battery tester 24 may be positioned within a recess 25 formed in the exterior of tubular body 12 which is of generally the same dimension as tester 24. Tester 24 includes an indicator or display area 26 preferably located on a decorative background 28 which is complimentary to the overall exterior design of flashlight 10. Tester 24 also includes a region 30 indicated thereon, preferably by a decorative ink, to indicate the location of a switch which is depressed to close the circuit to activate the display.

Battery tester 24 is comprised of a means for completing the circuit between the poles of the battery within tubular body 12, a means for responding to the capacity of the battery and a means for indicating the capacity of the battery. A means for completing the circuit can be a tester circuit that is comprised of electrically conductive material such as a metallic foil, or a metallized plastic layer. Other examples include electrically conductive paints or inks, such as those that contain graphite, carbon, or metals or combinations thereof. The electrically conductive material is configured to have first and second ends that are connected to each other via an area of controlled resistivity. The first end is provided to make contact with a first terminal of the flashlight which is, in turn, in contact with one pole of the battery contained therein, and the second end is provided to make contact with a second terminal of the flashlight, which, in turn, is in contact with the opposite pole of the battery contained therein. These terminal contact ends are or will be connected to the terminals of the battery to complete the test circuit. Thus, when the tester circuit is completed, electric current can flow through the area of controlled resistivity. The term "controlled resistivity" means that the resistance is controlled to be within the range to activate the responsive means.

The resistance in the area of controlled resistivity can vary or it can be constant. In one embodiment, it is desired to have a varying resistance to indicate the relative remaining useful life of a battery. For example, the current flowing through the tester circuit will generate a specific temperature. The temperature achieved will be proportional to the amount of current supplied by the battery. Thus, the area of controlled resistivity can be of varying width, e.g., tapered, or of varying thickness to achieve the temperature gradient. Alternatively, the area can be of constant width and constant thickness. A further alternative would involve the use of different conductive materials having different resistivities in the area of controlled resistivity. In addition, when using thermochromic materials, materials activated at different temperatures can be used along an area of constant resistance, or continuous or discontinuous segments of a thermochromic material could be used along an area of varying resistance.

The testing means can be further comprised of means for connecting the tester circuit to the terminals of the flashlight. This means can be terminal connectors that connect the opposite poles of the battery with the terminal contact ends of the tester circuit. Preferably, one terminal contact end of the circuit is out of contact with the terminal of the flashlight so that the tester circuit is open. In this embodiment, the testing means is further comprised of means for turning the tester circuit on, such as a switch. In a preferred embodiment of the invention, one end of the circuit is permanently in contact with one pole of the battery through a terminal in the flashlight tubular housing. The opposite end contains a switch which places it in electrical contact with a second terminal in the flashlight housing, which is in electrical continuity with the opposite pole of the battery contained therein. The switch of the circuit includes a small opening in a layer between the flashlight terminal and the end of the tester circuit. By forcing the end of the circuit into contact with the flashlight terminal through the opening, the switch is closed and the tester circuit is completed to test the battery. This contact can be conveniently made by applying finger or thumb pressure to the switch area. When the force on the switch is removed, the switch opens and interrupts the circuit.

The testing means further comprises a means for indicating the capacity of the battery. The indicating means will be in responsive contact with the area of controlled resistivity and will respond to and indicate a state that is present in that area. For example, a temperature increase will be generated in that area when a current flows through the tester circuit. If the indicating means is a thermally sensitive material, then it is in thermally transferable contact with the area of controlled resistivity. If the indicating means is an electrical field or voltage sensitive material, then the indicating means will be in electrical contact with the area of controlled resistivity. The indicating means will indicate the capacity of the battery to the consumer. This indication can be qualitative such as a "good" or "bad" reading, or quantitative such as a remaining percentage of useful life.

In one embodiment, the indicating means can be a thermally sensitive material that is in responsive contact with the area of controlled resistivity of the tester circuit. Thus, the heat generated in the area of controlled resistivity in the tester circuit can be transferred to the thermally sensitive material. The thermally sensitive materials change color in response to a temperature change. The material is readily viewable to a consumer so that, based on the color change, the consumer can determine whether the battery is good or needs to be replaced.

To facilitate a color change effect, the thermally sensitive material can be placed over a contrasting color layer. This color layer can be applied by printing directly onto the film base or onto the electrically conductive circuit. A message can also be printed onto the contrasting color layer that can be viewed by the consumer when the thermally sensitive material changes color. An alternative means of providing a message can employ a stencil in the form of a thermally non-conductive layer, e.g., a layer of double-faced tape in which the message is cut out of the thermally non-conductive layer so that a thin air insulation layer is left in that area under the thermally sensitive material. When the tester is activated, this cut-out message portion, which has poorer thermal conductivity than the surrounding area, results in the thermally sensitive material directly over the message area changing color, while the surrounding thermally sensitive material, which serves as a heat sink, remains its original color, thus outlining the message. The stencil can be reversed so that the message is made of the thermally non-conductive layer and is surrounded by the air insulation layer. When this tester is activated, the thermally sensitive material directly over the message portion will remain its original color because of better thermal conductivity, and the surrounding thermally sensitive material over the air insulation layer will change color, thereby outlining the message.

Examples of thermally sensitive materials are liquid crystal materials and thermochromic inks. The indicating materials can be used singularly or in combination. For example, in one embodiment, layers of different indicating material are employed. The layers are activated at different temperatures or states and can be designed to change different colors at different temperatures. For example, the layers of different indicating material are arranged in decreasing temperature of activation with the lowest temperature material in the top layers. Alternatively, the indicating material can be designed to test the battery at different ambient temperatures by using materials that activate at different temperatures. The material activatable at the corresponding temperature would be associated with the different circuits. For example, the label could be designed with a window for testing at 40° F., a window for testing at 70° F. and a window for testing at 90° F. Depending on what the ambient temperature is, the consumer would look at the corresponding window. Examples of suitable liquid crystal materials are of the cholesteric type, such as cholesteryl oleate, cholesteryl chloride, cholesteryl caprylate and the like. Examples of suitable thermochromic inks include those comprised of a die, developer and desensitizing agent that are disclosed in U.S. Pat. No. 4,835,475, incorporated herein by reference. Such inks are available from Matsui International Corp. of El Segundo, Calif. and Sakura Color Products Corporation of Osaka, Japan.

In another embodiment of this invention, the indicating and responding means can be materials that respond to a voltage change or an electric field. These materials are responsive directly to the remaining capacity of the battery as the current flows through the tester circuit, and so will be disposed in electrically responsive contact with the area of controlled resistivity. Materials for this purpose are known as electrochromic materials and are commercially available. For example, one such provider of such materials is the Donnelly Corporation of Holland, Mich.

The battery tester of this invention can also comprise additional insulative layers, printing layers, protective layers and the like. Suitable materials for use as the different layers include plasticized or unplasticized polyvinyl chloride, polyester, metallic films, paper and the like, and they are prepared by known methods, such as laminating the layers together and adhering to each other via an adhesive. In embodiments where conductive ink will be in contact with the adhesive, it is desirable to employ a primer layer or sealant layer between the conductive ink and the adhesive. Suitable primers and adhesives include UV-cured dielectric materials such as Dielectric LV-3728-39 from Emerson & Cuming Inc. of Woburn, Mass., dielectric ML-25198 from Acheson Colloids of Port Huron, Mich., and liquitex acrylic gesso available from Binney & Smith Inc. of Easton, Pa.

Figure 3:
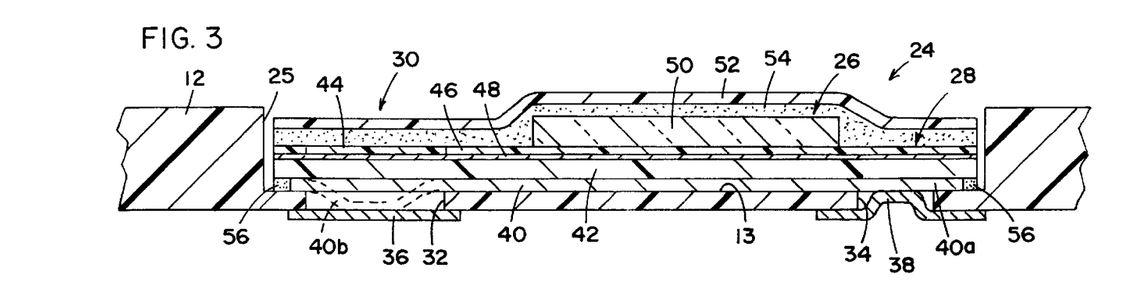
FIG. 3 is a fragmentary sectional view of one embodiment of the battery tester taken along line III—III shown in FIG. 2.

In one embodiment of the flashlight having the externally attached battery tester 24, flashlight 10 has an elongate tubular body 12, such as shown in FIG. 1, made from a non-conductive material such as polypropylene, ABS, polystyrene or similar material. As shown in FIG. 3, tubular housing 12 is preferably perforated by two spaced apart holes 32, 34. Hole 32 preferably overlies a first conductor or terminal 36 which is in electrical contact with one pole of the battery contained within the flashlight tubular body 12. Similarly, hole 34 is located adjacent and receives a second conductor or terminal 38 which is in electrical contact with the opposite pole of the battery contained within the tubular body 12. It is preferred that conductor 38 be shaped to be received within hole 34 such that a portion is at least flush with or protrudes slightly with respect to the outer surface 13 within recess 25 for reasons which will become apparent below. One of the conductors or terminals 36 and 38 may be the same conductor used to complete the electrical circuit through the flashlight switch to activate the lamp in lamp assembly 18.

Figure 5:
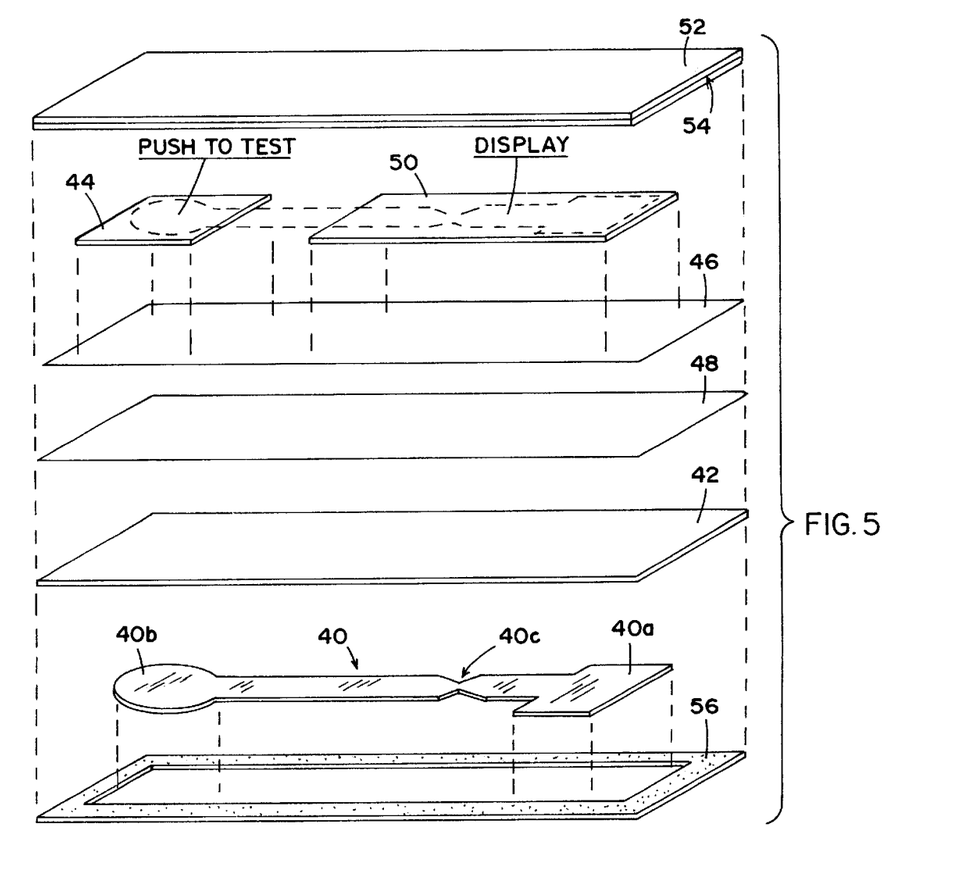
FIG. 5 is an exploded view of the battery tester shown in FIG. 3.

Referring to FIGS. 3 and 5, adhered to the exterior of tubular body 12 and located above holes 32, 34, is a conductive foil, film, or ink 40 made from or containing silver, carbon, nickel or other conductive mixture applied to a substrate 42. In a preferred embodiment, conductive circuit 40 is a conductive ink layer on the order of 0.5 mil thick and is adhered to substrate 42 having a thickness on the order of 1–5 mils and preferably 2–3 mils.

Conductive ink layer 40 is preferably printed on one side of substrate 42 in a shape which may have first and second ends 40*a* and 40*b*, respectively, interconnecting a strip 40*c* which is an area of controlled resistivity. Although area 40*c* of controlled resistivity may be achieved using the various techniques described earlier, it is preferred in the case of conductive ink layer 40 that a restriction be created in an area which coincides with the location of the display 26 described above. Fixed to substrate 42 on a side opposite that containing conductive circuit 40 may be one or more layers 44, 46, and 48 of decorative ink or metallized film to provide a decorative pattern for background 28 and switch 30. Deposited on the decorative inks in a region overlying and coinciding with the controlled resistivity portion of conductive circuit 40 is a 2 to 3 mil thick layer of thermochromic ink 50, such as those described above. The thermochromic ink and decorative ink layers are covered by a protective top layer 52 having a thickness of approximately 1 mil bonded thereto by an approximately 0.5 mil thick layer of laminating adhesive 54. The entire battery tester 24 is then retained against the exterior of flashlight tubular body 12 by approximately a 0.5 mil thick layer of pressure sensitive adhesive 56 to hold the battery tester 24 above holes 32, 34 and flashlight terminals 36, 38. Alternatively, adhesive layer 56 may be omitted and an adhesive layer applied, e.g., by roll-coating, to the face of substrate 42 adjacent conductive ink 40. In that embodiment, a primer or sealant layer (not shown) may be disposed between conductive ink layer 40 and substrate 42 to prevent any undesirable reaction between the conductive ink and the adhesive.

Figure 4:
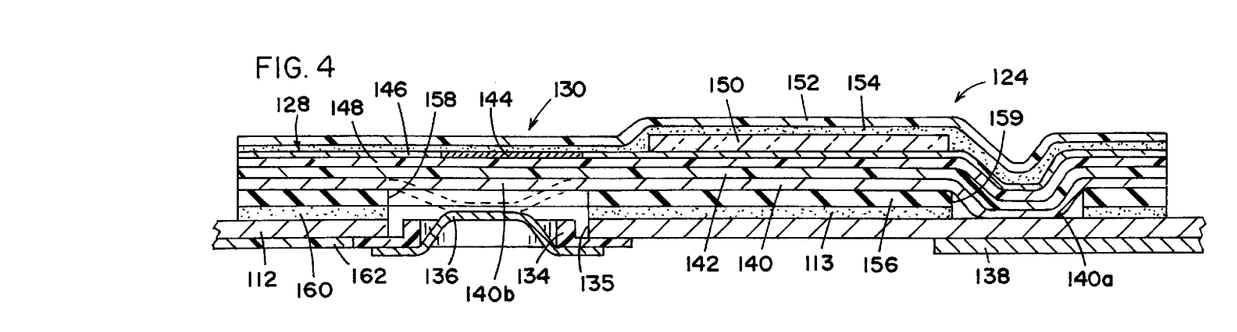
FIG. 4 is a fragmentary sectional view of a second embodiment of the battery tester taken along line IV—IV shown in FIG. 2.
Figure 6:
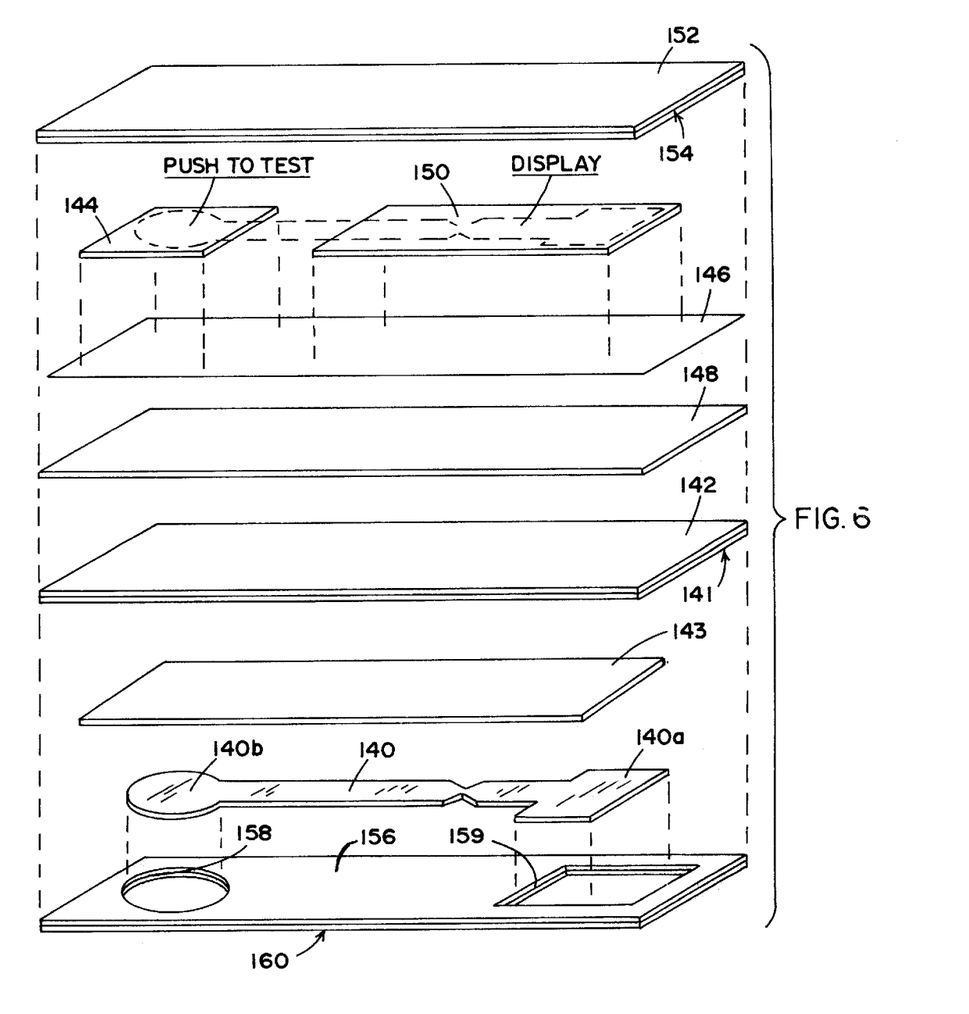
FIG. 6 is an exploded view of the battery tester shown in FIG. 4.

In the case of flashlights or portable lanterns having metallic or conductive bodies 112, the externally attached battery tester 124, shown in FIGS. 4 and 6, will be attached to the exterior surface 113 of the flashlight body or housing and include a conductive circuit 140 similar to that described above adjacent to or otherwise printed on one surface of PVC or polyester substrate 142. On the opposite surface of substrate 142, to that containing conductive circuit 140, are one or more layers 144, 146, and 148 of decorative ink or metallization used to compose or form the background 128 of tester 124. Deposited or printed on the decorative ink and/or metallization layer is the thermochromic ink 150 in an area preferably limited to that of the controlled resistivity portion of conductive circuit 140. The entire top of tester 124 is then covered by a protective top layer 152 of e.g., PVC, polyester, or polyethylene, which is bonded to tester 124 by a layer of adhesive 154.

The side of substrate 142 containing conductive circuit 140 is bonded to an insulative layer 156 with localized portions 158, 159 of the insulative layer left open which coincide with portions of conductive layer 140 adapted to engage flashlight terminals 136, 138. Insulative layer 156 is, in turn, bonded to the exterior of flashlight tubular body 112 by an adhesive 160. Adhesive layer 160 is similar in shape to insulative layer 156 and does not cover that portion of conductive circuit 140 adapted to make electrical contact with terminals 136, 138.

Conductive circuit 140 can be printed, using conductive ink, on the side of substrate 142 adjacent insulative layer 156 and can be surrounded by an adhesive layer (not shown here) to adhere substrate 142, carrying conductive ink layer 140, to insulative layer 156. Alternatively, an adhesive layer such as layer 141 shown in FIG. 6 can be applied, e.g., by printing or roll-coating, to that side of substrate 142. In that embodiment, a primer or sealer 143 would be coated over the adhesive layer before printing the conductive ink 140 thereon to prevent any undesirable reaction between the adhesive layer and the conductive ink. If the conductive circuit 140 is a metal foil, an adhesive layer, such as layer 141, can again be applied to that surface of substrate 142 adjacent the conductive circuit 140. This adhesive layer 141, which extends beyond the edges of conductive circuit 140, adheres substrate 142 and conductive circuit 140 to insulative layer 156, which in turn is adhered to the exterior of the flashlight body 112 by adhesive layer 160.

The metallic tubular body 112 of the flashlight is modified slightly from that of the plastic tubular body 12 described earlier. Flashlight terminal 138 is preferably in electrical contact with tubular body 112 which is in electrical contact with one end 140*a* of conductor 140. Flashlight terminal 136 is separated from the inside of tubular body 112 by an insulative material 162 and by an annular insulator 134 disposed within hole 135 piercing body 112. Terminal 136 is formed to extend slightly up through hole 135 and insulator 134 to allow terminal 136 and the second end 140*b* of conductor 140 to come into electrical contact by depressing switch area 130 without grounding against the metallic tubular body 112.

In operation, battery tester 24, 124 is activated by depressing switch area 30, 130 to force end 40*b*, 140*b* of conductor 40, 140 into electrical contact with flashlight terminal 36, 136, thus completing the circuit through conductor 40, 140. The increase in heat associated with the current flowing through the controlled resistance portion of conductor 40, 140 is transferred through substrate 42, 142 to thermochromic ink 50, 150. Thermochromic ink 50, 150 then reacts and changes color in response to the localized heating and thus indicates to the user the remaining capacity of the battery within the flashlight.

Figures 7A, 7B:
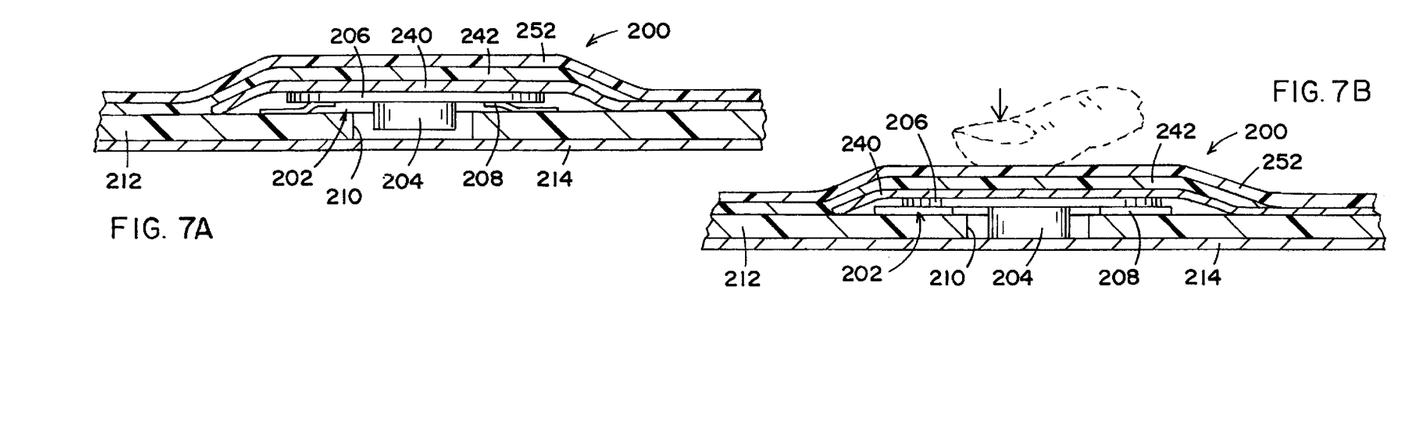

In an alternative embodiment of the battery tester 24, 124 described above, a switch 200, shown in FIGS. 7*a* and 7*b*, may include a Belleville spring mechanism 202 including a conductive plunger such as cylinder 204 terminating at an upper end in a flange 206. Plunger 204 is positioned within a Belleville washer 208 bent to form a spring which supports plunger 204 by flange 206 such that plunger 204 overlies hole 210 formed in the flashlight body 212 and is away from flashlight terminal 214. Belleville spring mechanism 202 is overlain by the conductive circuit 240 and substrate 242 so that upon depression of switch 200, plunger 204 makes electrical contact with one flashlight terminal 214, such as those described above. The conductive circuit 240 and substrate 242 are, in turn, overlain by one or more decorative layers such as described above, but not shown, and protective layer 252. In this alternate embodiment, it is axiomatic that the opposite end of conductor circuit 240 is in permanent electrical contact with the opposite flashlight terminal to complete the circuit.

This embodiment of the switch operates in much the same manner as the previous embodiments. As shown in FIG. 7b, the operator depresses switch 200 which moves plunger 204 downwardly into contact with flashlight terminal 214. Plunger 204, which is conductive, contacts circuit 240 causing current to flow therethrough and heat the thermochromic indicator described earlier. Release of switch 200 results in Belleville spring washer 208 moving plunger 204 upwards and away from flashlight terminal 214, opening the tester circuit.

The above description is considered that of the preferred embodiments only. Modifications of the invention will occur to those skilled in the art and to those who make or use the invention. Therefore, it is understood that the embodiments shown in the drawings and described above are merely for illustrative purposes and are not intended to limit the scope of the invention, which is defined by the following claims as interpreted according to the principles of patent law, including the doctrine of equivalents.

The embodiments of the invention in which an exclusive property or privilege is claimed are defined as follows:

1. A flashlight battery tester comprising in combination:
   a flashlight housing made from a dielectric material and having first and second terminals, each electrically connected to one pole of at least one battery disposed within said housing; and
   a battery tester circuit mounted generally flush to an exterior surface of said flashlight housing and having:
      a conductive film, a first end of said film electrically connected to said first terminal, and a second end of said film defining a first switch biased above and flexibly engageable with said second terminal to permit a current to pass through said conductive film, and produce a signal indicative of the strength of said at least one battery,
      a flexible, dielectric layer having opposing sides,
      a conductor layer having a variable resistance portion disposed on one side of said flexible dielectric layer,
      a protective layer disposed on an opposite side of said flexible dielectric layer,
      an indicator layer disposed between said protective layer and said flexible dielectric layer and aligned substantially opposite said variable resistance portion of said conductor layer,
      an adhesive layer disposed on said conductor layer and said flexible dielectric layer for adhering said flashlight battery tester to said flashlight housing, and
      a switch for placing said second end of said conductor in electrical contact with said second terminal to activate said battery tester display circuit, wherein said switch includes:
         a spring disposed over said second terminal between said conductor layer and said second terminal;
         a conductive plunger disposed within said spring and having a first end in electrical contact with said conductor layer and the opposite end of said plunger translatable into contact with said second terminal.

2. A battery tester for use on the exterior of a flashlight to measure the strength of batteries in the flashlight, the flashlight having a non-conductive housing for retaining at least one battery therein, and a light source operably connected through a first switch to said battery, the battery tester comprising in combination:
   a conductive layer fixed to the exterior of said housing and having a first end operably coupled through a hole in said non-conductive housing to a first terminal adapted for coupling to one pole of said at least one battery and a second end operably connectable through a second hole in said non-conductive housing to a second terminal adapted for coupling to an opposite pole of said at least one battery, said conductor layer having a region resistive to an electrical current flowing therethrough;
   a thermochromic layer overlying said conductor layer for displaying a capacity of the battery in response to a resistance of said electrical current flowing through said conductive layer; and
   a second switch defined at said second end of said conductor layer and biased away from said opposite pole of said battery in a manner such that relative movement of said switch toward said opposite pole operably connects said second end of said conductive layer to said opposite pole of said at least one battery, permitting an electrical current to pass through said region, wherein said switch further includes a conductive plunger having one end in electrical contact with said conductor layer and a second end adapted to engage said second terminal, and a spring positioned between said conductive plunger and said second terminal for biasing said switch in an open position.

3. The battery tester as defined by claim 2, further including:
   a dielectric layer disposed between said conductor layer and said thermochromic layer;
   a protective layer overlying said thermochromic layer and adhered to said dielectric layer; and
   an adhesive bonding said dielectric layer and said conductor layer to the exterior of said flashlight.

4. The battery tester as defined by claim 3, further including a sealer disposed between said conductor and said adhesive.

5. A portable lighting device comprising in combination:
   an insulative housing, having first and second holes extending through a wall of said housing, and adapted to retain at least one battery therein;
   a light source adapted to be selectively connected to a battery retained in said insulative housing; and
   a laminated battery tester adhered to an exterior surface of said insulative housing and having a first end disposed over said first hole operably connected to one pole of said battery and a second end disposed over said second hole and configured to engage an opposite pole of said at least one battery, said laminated battery tester providing an indication of the battery strength, wherein said laminated battery tester includes:
      a flexible substrate having opposite sides;
      an indicator located on one side of said substrate for indicating the strength of said battery;
      a conductor located on an opposite side of said substrate and operably connected to said switch for selectively completing a circuit between said poles of said battery; and
      a resilient switch incorporated within said laminated battery tester for placing said second end in electrical contact with said opposite pole of said battery, wherein said switch includes:
  first and second terminals in a portable lighting device in electrical contact with opposite poles of said battery;
  a first end of said conductor layer in electrical contact with said first terminal;
  a second end of said conductor layer disposed adjacent and spaced from said second terminal and selectively placed in contact with said second terminal by urging said second end against said second terminal, wherein said second end of said conductor layer is separated from said second terminal by an insulating layer, said insulating layer having an opening therein to permit deflection of said second end of said conductor layer into contact with said second terminal upon application of a force on said flexible dielectric substrate, and a return of said flexible dielectric substrate to its original position once the force is removed; and
  a conductive plunger having one end in electrical contact with said conductor layer, and a second end adapted to engage said second terminal; and
  a spring positioned between said conductive plunger and said second terminal for biasing said switch in an open position.

6. A portable lighting device, comprising in combination:
a housing, having first and second holes extending through a wall of said housing, and adapted to retain at least one battery therein;
a laminated battery tester adhered to an exterior surface of said housing including a flexible substrate having opposite sides, an indicator located on one side of said flexible substrate for indicating the strength of said battery, a conductor located on an opposite side of said flexible substrate, a first end of which is disposed over said first hole and operably connected to one pole of said battery and a second end disposed over said second hole and configured to selectively engage an opposite pole of said battery; and
a switch for selectively placing said second end of said conductor into contact with said opposite pole of said battery, including first and second terminals in the portable lighting device each in electrical contact with a pole of said battery, said second end of said conductor disposed adjacent and spaced from said second terminal, a spring disposed over said second hole between said conductor and said second terminal, a conductive plunger disposed within said spring and having a first end in electrical contact with said second end of said conductor and an opposite end translatable into contact with said second terminal thereby placing said conductor into contact with said first terminal.

7. A flashlight battery tester, comprising in combination:
a flashlight housing made from a dielectric material and having first and second terminals, each operably connected to one pole of at least one battery disposed within said housing;
a battery tester circuit mounted generally flush with an exterior surface of said flashlight housing and having a conductor layer with a variable resistance portion disposed between first and second ends; a protective layer disposed on one side of said conductor layer; an indicator layer disposed between said protective layer and said conductor layer and aligned substantially opposite said variable resistance portion of said conductor layer; and an adhesive layer disposed on said conductor layer and said protective layer for adhering said battery tester to said flashlight housing, said first end of said conductor layer operably connected to said first terminal; and
a switch having a spring, disposed between said second end of said conductor layer and said second terminal, a plunger disposed within said spring and having a first end in contact with said conductor layer and an opposite end selectively contacting said second terminal for placing said second end of said conductor layer into contact with said second terminal to permit a current to pass through said conductor layer, and produce a signal indicative of the strength of said at least one battery.

8. A portable lighting device, comprising in combination:
a housing adapted to retain at least one battery therein and having first and second terminals contacting said battery;
a laminated battery tester adhered to an exterior surface of said housing and having a first end connected to said first terminal and a second end disposed over said second terminal and configured to selectively engage said second terminal, said laminated battery tester including a flexible substrate having opposite sides; an indicator located on one side of said flexible substrate for indicating the strength of said battery; and a conductor located on an opposite side of said flexible substrate with a first end coupled to said first terminal and a second end disposed over said second terminal, said second end of said conductor separated from said second terminal by an insulating layer, said insulating layer having an opening therein to permit deflection of said second end of said conductor into contact with said second terminal upon application of a force on said flexible substrate, and a return of said flexible substrate to its original position once the force is removed; and
a switch disposed between said second end of said conductor and said second terminal for selectively coupling said conductor with said at least one battery, said switch including a conductive plunger having one end in contact with said conductor, and a second end adapted to selectively contact said second terminal; and
a spring positioned between said conductive plunger and said second terminal for biasing said switch in an open position.

* * * * *